(12) United States Patent
Poenitzsch et al.

(10) Patent No.: US 11,192,184 B2
(45) Date of Patent: Dec. 7, 2021

(54) ENGINEERED PLATELETS FOR ADDITIVE MANUFACTURING

(71) Applicant: Southwest Research Institute, San Antonio, TX (US)

(72) Inventors: Vasiliki Z. Poenitzsch, Alamo Heights, TX (US); Randy L. McKnight, Castroville, TX (US); Carl F. Popelar, San Antonio, TX (US); Michael A. Miller, San Antonio, TX (US); John H. Macha, Helotes, TX (US); Kent E. Coulter, Boerne, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 207 days.

(21) Appl. No.: 16/446,878

(22) Filed: Jun. 20, 2019

(65) Prior Publication Data

US 2020/0398344 A1 Dec. 24, 2020

(51) Int. Cl.
*B22F 5/00* (2006.01)
*B33Y 10/00* (2015.01)
(Continued)

(52) U.S. Cl.
CPC .............. *B22F 5/003* (2013.01); *B22F 5/006* (2013.01); *B22F 2303/405* (2013.01);
(Continued)

(58) Field of Classification Search
CPC .... B22F 5/003; B22F 5/006; B22F 2303/405; B22F 2999/00; B22F 1/0007;
(Continued)

(56) References Cited

U.S. PATENT DOCUMENTS 4,039,100 A * 8/1977 Wells ................. B65D 17/4012
220/269
5,135,812 A 8/1992 Phillips et al.
(Continued)

OTHER PUBLICATIONS

Slotwinski, J.A. et al; "Metrology Needs for Metal Additive Manufacturing Powders"; JOM, vol. 67, No. 3, (2015) 538-543.
Sutton, A. T. et al; "Powders for Additive Manufacturing Processes: Characterization Techniques and Effects on Part Properties", Solid Freeform Fabrication 2016; 27th Annual International Symposium, Texas, U.S.A (27 pgs).
(Continued)

*Primary Examiner* — Rick K Chang
(74) *Attorney, Agent, or Firm* — Grossman, Tucker, Perreault & Pfleger, PLLC

(57) ABSTRACT

The present disclosure is directed to systems and methods for producing a metal-containing powder useful for additive manufacturing. The metal-containing powder includes a plurality of metal-containing platelets having a defined physical geometry and a defined aspect ratio. The metal platelets may be produced by depositing a metal layer on a substrate that includes one or more recessed or raised surface features. The one or more recessed or raised surface features create a fracture pattern in a metal layer deposited across at least a portion of the one or more surface features. By separating the metal layer from the substrate and fracturing the metal layer along the fracture pattern, a plurality of metal platelets are produced. In some embodiments, a release agent may be disposed between the metal layer and the substrate to facilitate the separation of the metal layer from the substrate.

28 Claims, 11 Drawing Sheets

(51) Int. Cl.
  *C23C 14/58* (2006.01)
  *C23C 14/56* (2006.01)
  *B33Y 40/00* (2020.01)
  *B33Y 80/00* (2015.01)
  *C23C 14/00* (2006.01)

(52) U.S. Cl.
  CPC .............. *B33Y 10/00* (2014.12); *B33Y 40/00* (2014.12); *B33Y 80/00* (2014.12); *C23C 14/0005* (2013.01); *C23C 14/56* (2013.01); *C23C 14/5873* (2013.01)

(58) Field of Classification Search
  CPC ... B22F 1/0055; C23C 14/5873; C23C 14/56; C23C 14/0005; C23C 28/02; B33Y 40/00; B33Y 10/00; B33Y 80/00; B33Y 70/00
  See application file for complete search history.

(56) References Cited

U.S. PATENT DOCUMENTS

| | | |
|---|---|---|
| 6,317,947 B1 | 11/2001 | Ruschmann |
| 2002/0163558 A1 | 11/2002 | Rivas et al. |
| 2005/0029942 A1 | 2/2005 | Chiu et al. |
| 2007/0238296 A1 | 10/2007 | Shimizu |
| 2012/0088070 A1 | 4/2012 | Nishi |
| 2014/0048981 A1 | 2/2014 | Crump et al. |
| 2017/0141315 A1 | 5/2017 | Ikenaga |

OTHER PUBLICATIONS

International Search Report and Written Opinion dated Sep. 18, 2020, issued in PCT International Patent Application No. PCT/US2020/038561, 9 pages.

* cited by examiner

ENGINEERED PLATELETS FOR ADDITIVE MANUFACTURING

TECHNICAL FIELD

The present disclosure relates to platelets useful in additive manufacturing applications.

BACKGROUND

Additive manufacturing (AM) processes use three-dimensional object data, such as 3D model data generated by a computer aided design system, to deposit and combine layers of material to produce a 3D part. Materials used on such AM processes include thermosetting polymer powders and metal powders. The performance of a metal powder-based additive manufacturing process is impacted by a variety of factors. One key factor is the metal powder used as a raw material in the AM process. Variations in powder characteristics can lead to non-uniform layering, inconsistent bulk density, increased defects, undesired mechanical properties and poor surface roughness. Beyond these current material-related technical issues, there are concerns if the existing materials sources are advanced enough to meet future potential needs.

Current metal AM powders are most commonly produced by gas atomization. In this process, the metal feedstock is melted under an inert gas or in a vacuum atmosphere; then, the chamber is back-filled with gas to force molten alloy through a nozzle. High-velocity gas (air, nitrogen, helium or argon) impinges into the flowing melt and breaks it up into fine droplets. Interfacial tensions cause the molten metal droplets to form generally spheroidal particles as the molten metal droplets cool down and fall to the bottom of the atomization tower, where powders are collected. Gas atomization technology provides powders that are typically tens of micrometers in size and have morphologies that are generally spherical, although a given batch of powder may include instances of aberrant (i.e., non-spherical) morphologies.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
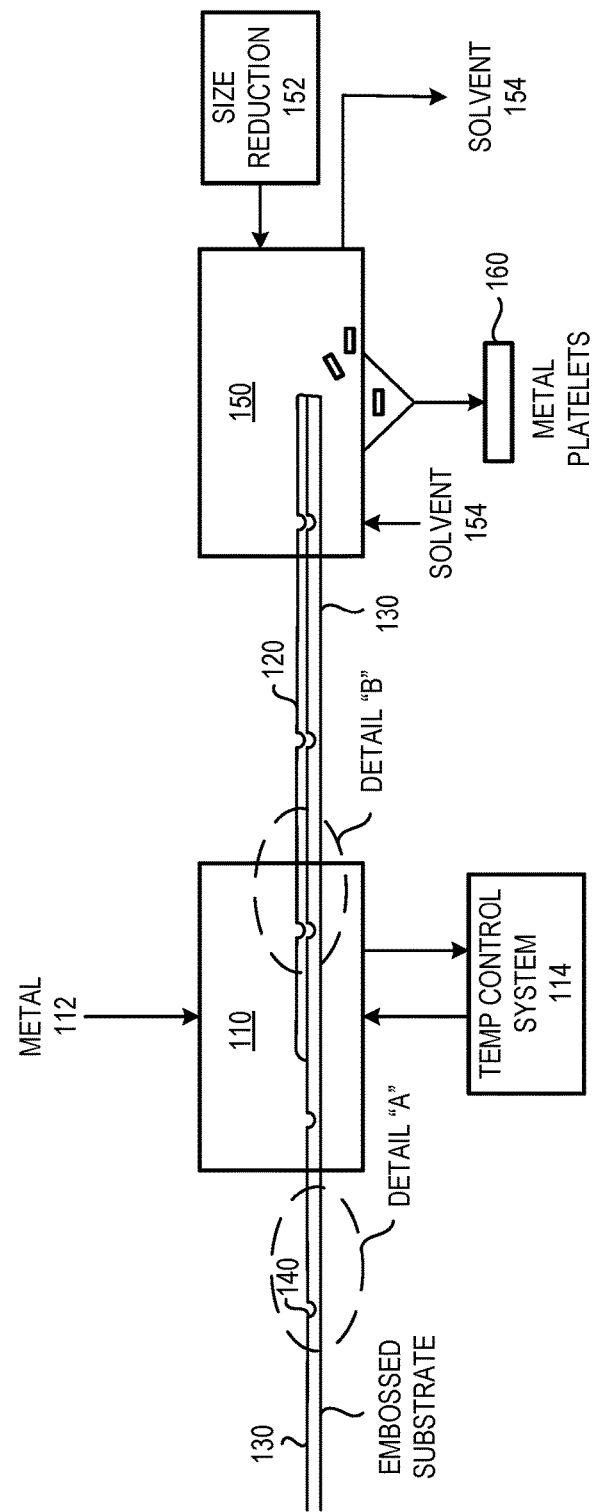
FIG. 1 is a block flow diagram of an illustrative platelet production system that includes a metal deposition system to deposit one or more metal layers on a substrate that includes a one or more repeating or non-repeating, recessed, surface features and a substrate removal system to separate the one or more metal layers from the substrate, in accordance with at least one embodiment described herein.
Figure 1:
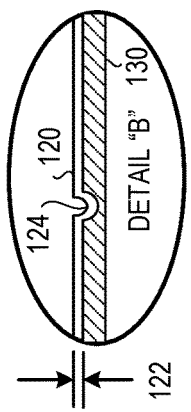
Figure 1:
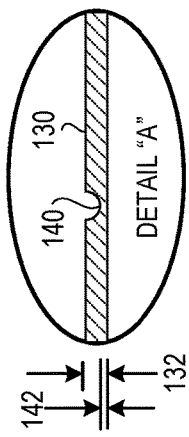

Although the following Detailed Description will proceed with reference being made to illustrative embodiments, many alternatives, modifications and variations thereof will be apparent to those skilled in the art.

DETAILED DESCRIPTION

The systems and methods disclosed herein beneficially provide platelets having a defined thickness, physical geometry, dimensions, and/or aspect ratio useful in AM processes.

The systems and methods disclosed herein produce platelets having a defined thickness and physical geometry by depositing a metal layer on a substrate that includes one or more surface features such as a raised or recessed pattern. The one or more surface features form a fracture pattern in the deposited metal layer. The fracture pattern is understood herein as a physical feature, in the pattern, that allows for fracture and recovery of individual platelets. Accordingly, once separated from the substrate, the metal layer is comminuted, preferentially fracturing along the fracture pattern created by the one or more surface features formed in the substrate. Where the substrate includes a one or more regular, symmetric, and/or repeating surface features, comminuting the metal layer produces metal platelets having one or more desirable characteristics amenable to the AM process. Such characteristics may include metal platelet morphology, composition, aspect ratio, and/or physical geometry. By varying the one or more surface features formed on the substrate, metal platelets having different morphologies, aspect ratios, and/or physical geometries may be produced.

The substrate may include a decomposable substrate on which the metal layer is deposited. The substrate may include a resilient material and a release agent may be disposed between the metal layer and the resilient substrate to facilitate the release or separation of the metal layer from the substrate. The metal layer may include one or more metal layers. Each of the one or more metal layers may include one or more metals and/or metal-containing materials.

A metal platelet manufacturing method is provided. The method may include: depositing at least one metal layer across at least a portion of one or more surface features disposed at least partially across a first surface of a substrate to provide a metal layer having a fracture pattern corresponding to the one or more surface features; separating the metal layer from the substrate; and fracturing the metal layer along at least a portion of the fracture pattern to provide a plurality of metal platelets, one or more of the platelets having an aspect ratio greater than or equal to 5:1. In embodiments, the one or more surface features include a geometry or a thickness that is configured to provoke fracture and may therefore include, e.g., "U-shaped" or "V-shaped" channels recessed into the upper surface of the substrate. In other embodiments, the one or more surface features include raised or embossed surface features disposed on, about, or across at least a portion of the upper surface of the substrate. The platelets may have a thickness in the range of 100 nm to 5.0 μm.

Another metal platelet manufacturing method is provided. The method may include: vacuum depositing a first metal layer across at least a portion of one or more surface features disposed at least partially across a first surface of a substrate to provide a first metal layer having a first thickness; depositing a second metal layer having a second thickness across at least a portion of the first metal layer to provide a multi-layer metal, the multi-layer metal having a fracture pattern corresponding to one or more surface features; separating the multi-layer metal from the substrate; fracturing the multi-layer metal along at least a portion of the fracture pattern to provide a plurality of metal platelets, each of the platelets having: a multi-layer metal thickness in the range of 100 nm to 5.0 μm; wherein one or more of the platelets have an aspect ratio greater than or equal to 5:1.

A metal-containing powder suitable for additive manufacturing is provided from the methods herein. The metal-containing powder includes a plurality of metal platelets, the metal platelets having a thickness, a longitudinal axis, and including: a physical geometry corresponding to an embossed pattern disposed across at least a portion of a first surface; wherein one or more of the platelets have a platelet thickness to platelet longitudinal axis aspect ratio greater than or equal to 5:1. Preferably, the aspect ratio for the one or more platelets so produced is greater than or equal to 5:1 and less than or equal to 10:1.

A metal platelet manufacturing method is provided. The method may include: moving a substrate that includes one or more surface features disposed at least partially across a first surface of the substrate from a substrate supply roll to a substrate take-up roll; depositing one or more metal layers across at least a portion of the one or more surface features disposed at least partially across the first surface of the moving substrate, the one or more metal layers having a fracture pattern corresponding to at least a portion of the one or more surface features; separating the one or more metal layers from the substrate; and fracturing the one or more metal layers along at least a portion of the fracture pattern to provide a plurality of metal platelets, wherein one or more of the platelets have an aspect ratio of greater than or equal to 5:1. Preferably, the aspect ratio for the one or more platelets so produced is again greater than or equal to 5:1 and less than or equal to 10:1.

A metal platelet manufacturing system is provided. The system may include: a substrate transit system to move a substrate that includes one or more surface features disposed at least partially across a first surface of the substrate from a substrate supply roll to a substrate take-up roll; one or more metal deposition systems to deposit one or more metal layers across at least a portion of the one or more surface features disposed at least partially across the first surface of the moving substrate, the one or more metal layers having a fracture pattern corresponding to at least a portion of the one or more surface features; a separation system to separate the one or more metal layers from the substrate; and a comminution system to fracture the one or more metal layers along at least a portion of the fracture pattern to provide a plurality of metal platelets, wherein one or more of the platelets has an aspect ratio of greater than or equal to 5:1. Preferably, the aspect ratio for the one or more platelets so produced falls in the range of greater than or equal to 5:1 and less than or equal to 10:1.

As used herein the terms "top," "bottom," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "aspect ratio" refers to a ratio of the longest in-plane axis of an object to the thickness of the object. For example, the aspect ratio of an oval disc having a thickness of 10 microns and a major axis having a length of 50 microns would be 50:10 or 5:1. Similarly, the aspect ratio of a square object having a thickness of 10 microns and a side length of 50 microns would be 70:10 or 7:1 (diagonal axis of 50 micron square is 50*1.414=~70 microns.

As used herein, the term "metal" refers to any number and/or combination of alkali metals (group IA elements), alkaline earths (group IIA metals), transition metals (group III-XII elements with partially-filled d subshell or the capacity to produce cations with an incomplete d subshell), lanthanides, and/or actinides. Similarly, the term "metal-containing material" refers to any compound, mixture, or material containing one or more alkali metals, alkaline earths, transition metals, lanthanides, and/or actinides.

FIG. 1 is a block flow diagram of an illustrative platelet production system 100 that includes a metal deposition system 110 to deposit one or more metal layers 120 on a substrate 130 that includes a one or more repeating or non-repeating, recessed, surface features 140 and a substrate removal system 150 to separate the one or more metal layers 120 from the substrate 130, in accordance with at least one embodiment described herein. As evident in Detail "A," in some embodiments, the one or more surface features 140 may include a pattern of recesses formed in the upper surface of the substrate 130. Deposition of the metal layer 120 having a thickness 122 across at least a portion of the substrate 130 produces a metal layer 120 having a fracture pattern 124 that includes the "U-shaped" surface features formed in the metal layer 120 by the recessed surface features 140 formed in the substrate 130. After separation from the substrate 130, the metal layer 120 fractures along the fracture pattern 124 to provide a plurality of metal platelets 160. For example, in embodiments, the use of repeating recessed surface features 140 on the surface of the substrate 130 provides a plurality of metal platelets 160. As noted, one or more of the platelets have an aspect ratio greater than or equal to 5:1. Preferably, the aspect ratio of the one or more platelets so produced falls in the range of greater than or equal to 5:1 and less than or equal to 10:1.

In embodiments where the substrate 130 includes one or more repeating surface features 140, the system 100 may selectively produce metal platelets 160 having a defined thickness and physical geometry. For example, the system 100 may produce metal platelets 160 having a hexagonal physical geometry, a thickness, and an aspect ratio within a defined range (e.g., greater than or equal to 5:1). In embodiments where the substrate 130 includes one or more non-repeating surface features 140, the system 100 may produce a plurality of metal platelets 160 having two or more differing physical geometries, for example where a first portion of the metal platelets have a first physical geometry, thickness, and aspect ratio and a second portion of the metal platelets have a second physical geometry, thickness, and aspect ratio that differs from the first physical geometry, thickness, and aspect ratio. Thus, combinations or mixtures of metal platelets 160 produced using the system 100 may be tailored to meet a particular application simply by adjusting, changing, or altering the one or more surface features 140 formed in the substrate 130.

For example, where a preferred metal platelet mixture includes 70 vol %, 5 micron thick by 50 micron diameter hexagonal platelets and 30 vol %, 5 micron thick by 25 micron diagonal square platelets, the preferred mixture may be produced by forming one or more raised or recessed surface features on, about, or across 70% of the surface area of the substrate 130 to provide a 50 micron diameter hexagonal pattern and 30% of the surface are of the substrate 130 to provide a 25 micron diagonal square pattern.

In embodiments, 50% or more of the metal platelets 160 produced using a substrate 130 containing one or more surface features 140 may have an aspect ratio of greater than or equal to 5:1. In one or more preferred embodiments, 60% or more; 70% or more; 80% or more; or 90% or more of the metal platelets 160 may have an aspect ratio of greater than 5:1. In embodiments, the metal platelets 160 produced by system 100 may have an aspect ratio of: greater than or equal to 5:1 or less than or equal to 10:1.

The metal deposition sub-system 110 includes any number and/or combination of currently available and/or future developed systems and/or devices capable of depositing or disposing one or more layers containing a metal or metal-containing material 112 across at least a portion one or more surface features 140 disposed in, on, or about the upper surface of the substrate 130. As depicted in FIG. 1, Detail "B"—the metal deposition sub-system 110 may deposit or otherwise dispose one or more metal-containing layers 120 that closely conforms to the one or more recessed surface features 140 disposed in, on, or about the upper surface of the substrate 130. Although only a single metal layer 120 is depicted in FIG. 1, any number of metal layers 120 may be deposited on, about, or across all or a portion of the upper surface of the substrate 130. By depositing one or more relatively thin metal layer(s) 120, a metal layer having a defined fracture pattern 124 corresponding to all or a portion of the one or more surface features 140 may be produced, thereby facilitating the selective comminution of the metal layer 120 to provide the plurality of metal platelets 160.

In embodiments, the metal deposition sub-system 110 may include one or more physical vapor deposition (PVD) systems and/or processes. Example PVD systems and/or processes include but are not limited to: electron beam PVD, evaporative deposition, close-space sublimation, pulsed laser deposition, sputtering, pulsed electron deposition, and similar. In embodiments, the metal deposition sub-system 110 may include one or more coolers or chillers to reduce the temperature of the substrate 130 prior to deposition of the one or more metal layers 120. The metal deposition sub-system 110 may include one or more vacuum roll coating processes and/or systems.

In embodiments, a temperature control system 114 may be fluidly and/or operably coupled to the metal deposition sub-system 110 to alter, adjust, and/or control the temperature of the substrate 130 prior to deposition of the metal 112 on the substrate 130. For example, the substrate 130 may be cooled to a temperature less than ambient or heated to a temperature greater than ambient prior to the deposition of the metal 112 on the substrate 130.

The metal layer 120 may be deposited as any number and/or combination of layers, where each of the layers having the same or a different thickness. The metal layer 120 may have a thickness 122 of 100 nm to 5.0 µm. In some implementations, the upper surface and/or the lower surface of the metal layer 120 may include one or more surface features, surface finishes, or surface treatments. In at least some embodiments, the metal layer 120 may include two or more metals forming a eutectic combination. In at least some embodiments, the metal layer 120 may include a tertiary compound containing titanium, aluminum, and vanadium (Ti-6Al-4V) deposited in one or more metal layers 120, each having a thickness of from about 1 µm to about 5 µm.

The substrate 130 may include any number or combination of materials that include one or more surface features 140. The substrate 130 may include a rigid, semi-rigid, or flexible material. The one or more surface features 140 may include any number and/or combination of repeating and/or non-repeating patterns. In some embodiments, the one or more surface features 140 may include a recessed, regular, polygonal pattern (trapezoid, triangle, square, pentagon, hexagon, etc.) In such embodiments, the polygonal shapes may have the same or different longitudinal axis lengths. In other embodiments, the one or more surface features 140 may include a repeating or non-repeating circular or oval pattern. Beneficially, the one or more surface features 140 may be selected to provide a plurality of metal platelets 160 having one or more desirable physical and/or chemical parameters. For example, the dimensions of the one or more surface features 140 may be selected to provide a desired bed packing density, melt rate, or similar.

In embodiments, the substrate 130 may be formed, produced, manufactured, and/or include one or more chemically degradable materials, for example, one or more materials soluble in a polar solvent (water, alcohol, etc.) and/or non-polar solvent (hexane, benzene, etc.). In other embodiments, the substrate 130 may be formed, produced, manufactured, and/or include one or more electromagnetically decomposable materials, for example, one or more photochemically degradable materials that deteriorates upon exposure to electromagnetic energy in the ultraviolet spectrum (i.e., electromagnetic energy with wavelengths less than 390 nanometers). In other embodiments, the substrate 130 may be formed, produced, manufactured, and/or include one or more thermally degradable materials, for example, one or more materials that deteriorates upon exposure to electromagnetic energy in the infrared spectrum (i.e., electromagnetic energy with wavelengths greater than 760 nanometers).

The substrate 130 may include any number of materials and/or layers. In embodiments, the substrate 130 may include one or more rigid material layers. In embodiments, the substrate 130 may include one or more flexible material layers. In embodiments, the substrate 130 may include one or more metallic and/or metal-containing layers. In embodiments, the substrate 130 may include one or more polymeric material layers, including one or more thermoplastic layers and/or one or more thermosetting layers. Example polymeric materials useful for forming all or a portion of the substrate include but are not limited to: polyamide, polycarbonate, polyester, polyethylene (HDPE, LDPE, PET, etc.), polypropylene, polyurethane, polystyrene, polyvinyl chloride, polyvinylidene chloride, acrylonitrile butadiene styrene, and/or combinations thereof.

The substrate 130 may have any physical dimensions and thickness 132. In embodiments, the substrate 130 may preferably have a thickness 132 of 1.0 mm to 3.0 mm. The one or more recessed surface features 140 may be formed integral with the substrate 130. In embodiments, the one or more recessed surface features 140 may be formed in the substrate 130, for example via laser ablation, or photolithography. The one or more recessed surface features 140 may extend a defined distance 142 into the upper surface of the substrate 130. The one or more recessed surface features 140 may extend a distance 142 into the upper surface of the substrate 130 at about 100 nm to 300 nm. Although depicted as generally semicircular "U-shaped" in profile in FIG. 1, the one or more recessed surface features 140 may have any cross-sectional geometry including but not limited to: square, rectangular, oval, elliptical, triangular, or combinations thereof. Such geometry can therefore provide that the metal profile so produced has a stress concentration along a desired pathway to provide for fracture and platelet can be more readily isolated from the as-formed metal layer. For example, in some embodiments, the one or more recessed surface features 140 may have a "V-shaped" profile. In at least some implementations, the one or more recessed surface features 140 may be stamped or otherwise pressed into the substrate 130.

In embodiments, the one or more recessed surface features 140 may form a regular, repeating, or uniform pattern, for example, the one or more recessed surface features 140 may define a pattern containing a plurality of similarly or differently sized polygons, circles, ovals, trapezoids, or similar regions having a defined physical geometry. In embodiments, the one or more recessed surface features 140 may form an irregular, non-repeating, or non-uniform pattern in, on, about, or across at least a portion of the upper surface of the substrate 130. For example, the one or more recessed surface features 140 may form a random pattern in, on, about, or across the upper surface of the substrate 130.

After deposition of the metal 112 on the substrate 130, the metal separation sub-system 150 separates the metal layer 120 from the substrate 130 and comminutes the metal layer 120 by fracturing the metal layer 120 at least along the fracture pattern 124 created by the one or more recessed surface features 140. The comminution of the metal layer 120 in the metal separation sub-system 150 produces a plurality of metal platelets 160. As depicted in FIG. 1, in some embodiments, the metal layer 120 separates from the substrate 130 as a consequence of the decomposition, degradation, or destruction of at least a portion of the substrate 130.

In some embodiments, the substrate 130 may include one or more materials soluble in one or more polar or non-polar solvents. In some embodiments, the substrate 130 may include one or more water soluble materials. In such instances the metal separation sub-system 150 may apply one or more solvents 154 sufficient to decompose the substrate 130 and release the metal layer 120. In such embodiments, the solvent 154 may be removed from the metal separation sub-system 150 for disposal or recycle. In other embodiments, the substrate 130 may include or be formed using one or more thermally destructible materials. In such instances, the metal separation sub-system 150 may apply thermal energy sufficient to decompose the substrate 130 and release the metal layer 120.

In embodiments, the separation of the metal layer 120 from the substrate 130 may be sufficient to fracture at least a portion of the metal layer 120 to provide at least a portion of the plurality of metal platelets 160. The metal separation sub-system 150 may include one or more size reduction devices or systems 152 to fracture the metal layer 120 to provide the plurality of metal platelets 160. In embodiments, such size reduction devices or systems 152 may cause the metal layer 120 to fracture or separate along the fracture pattern 124 formed in the metal layer 120. Example size reduction devices or systems 152 include but are not limited to: one or more pin mills, one or more hammer mills, one or more de-lumpers, one or more attrition mills, one or more cutters, one or more shredders, or combinations thereof.

Figure 2:
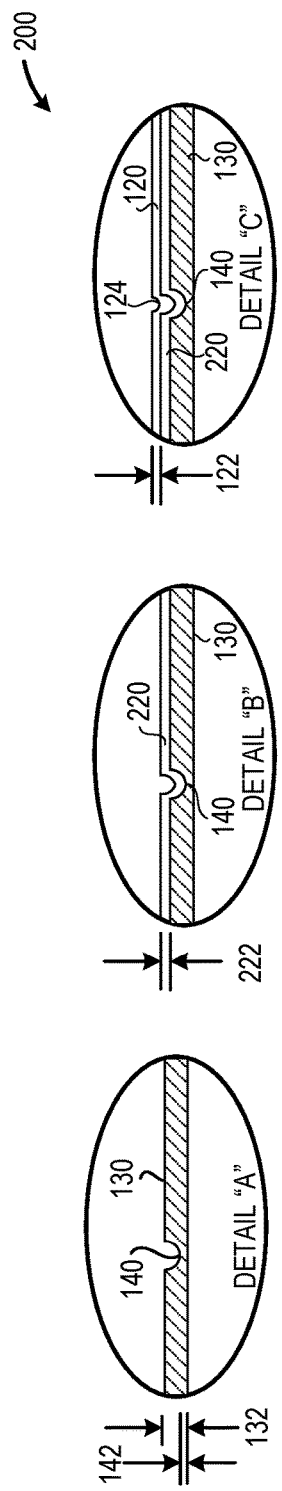
FIG. 2 is a block flow diagram of an illustrative platelet production system that includes a release agent application sub-system to deposit one or more release agents to provide a release agent layer between the substrate and the metal layer, in accordance with at least one embodiment described herein.
Figure 2:
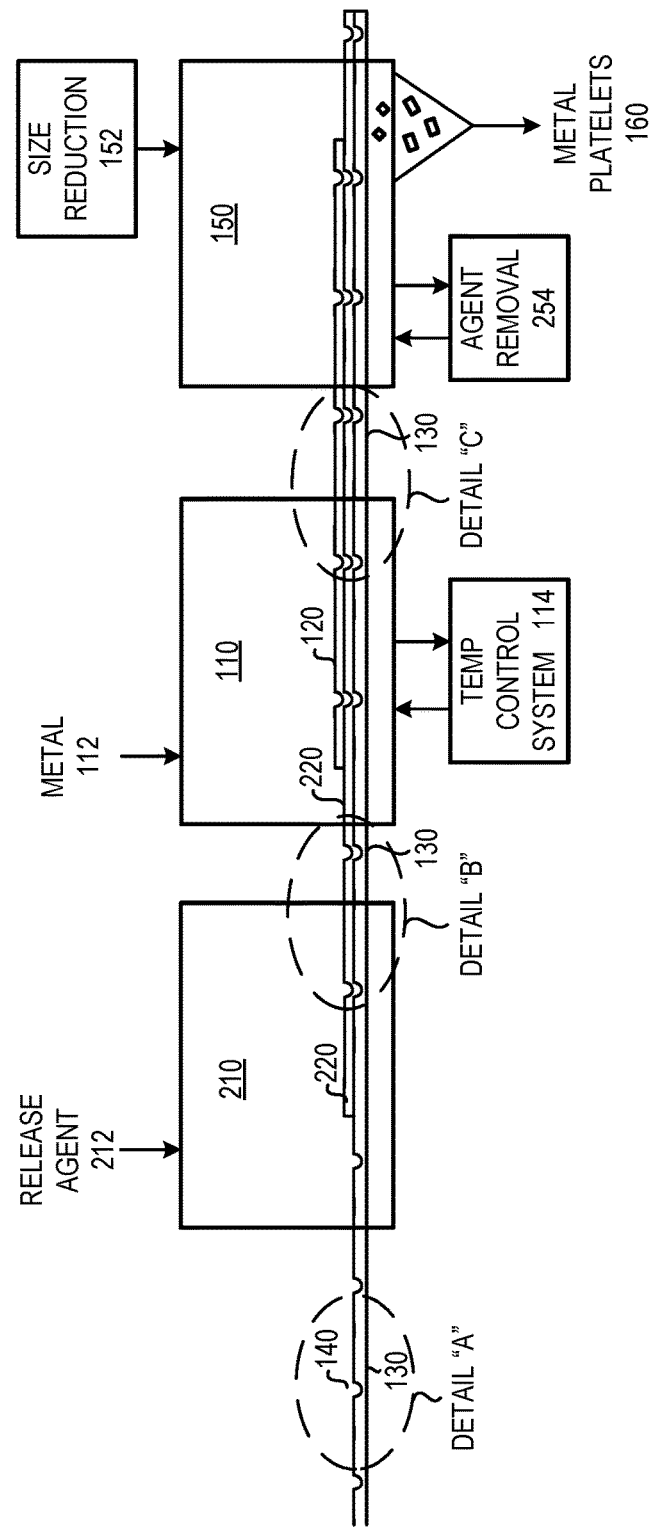

FIG. 2 is a block flow diagram of an illustrative platelet production system 200 that includes a release agent application sub-system 210 to deposit one or more release agents 212 to provide a release agent layer 220 between the substrate 130 and the metal layer 120, in accordance with at least one embodiment described herein. The release agent layer 220 may facilitate the separation of the metal layer 120 from the substrate 130. In embodiments, the release agent 212 may include one or more materials soluble in one or more polar solvents and/or one or more non-polar solvents. In embodiments, the release agent application sub-system 210 may apply the release agent 212 to all or a portion of the substrate 130 prior to deposition of the metal layer 120 on, across, or about all or a portion of the substrate 130. As depicted in FIG. 2, in embodiments using a release agent 212, the metal separation sub-system 150 may include one or more release agent removal sub-systems 254 that remove all or a portion of the release agent layer 220 to facilitate the separation of the metal layer 120 from the substrate 130.

In embodiments, the release agent 212 may include one or more photodegradable materials that degrade upon exposure to electromagnetic radiation within a defined spectrum. In such embodiments, the substrate 130 may include one or more materials that are at least partially transparent to electromagnetic radiation used to degrade the release agent 212. In such embodiments, the release agent removal sub-system 254 may include one or more sources that emit electromagnetic radiation having a spectral content sufficient to degrade at least a portion of the release agent 212.

In embodiments, the release agent 212 may include one or more thermally degradable materials that degrade at temperatures greater than ambient. In such embodiments, the release agent removal sub-system 254 may increase the temperature of the metal layer 120 and substrate 130 to a level sufficient to degrade at least a portion of the release agent 212.

The release agent 212 may include any number and/or combination of materials capable of facilitating the release or separation of the metal layer 120 from the substrate 130. In embodiments, the release agent may include one or more soluble salt compounds, such as sodium chloride, that can be dissolved using an aqueous solvent to facilitate or cause the release of the metal layer 120 from the substrate 130. In embodiments, the release agent application sub-system 210 may apply the release agent 212 as a liquid solution containing the release agent 212 that is subsequently dried to provide the release agent layer 220. In other embodiments, the release agent 212 may be applied as a dry material on, across, or about all or a portion of the upper surface of the substrate 130.

The release agent layer 220 may have any thickness 222. In embodiments, the release agent layer 220 may have a thickness 222 of about 100 nm to 300 nm. In at least some embodiments, the release agent may include sodium chloride and the release agent layer 220 may include one or more layers containing sodium chloride with each of the layers having a thickness 222 of from about 10 nm to about 50 nm.

Figure 3:
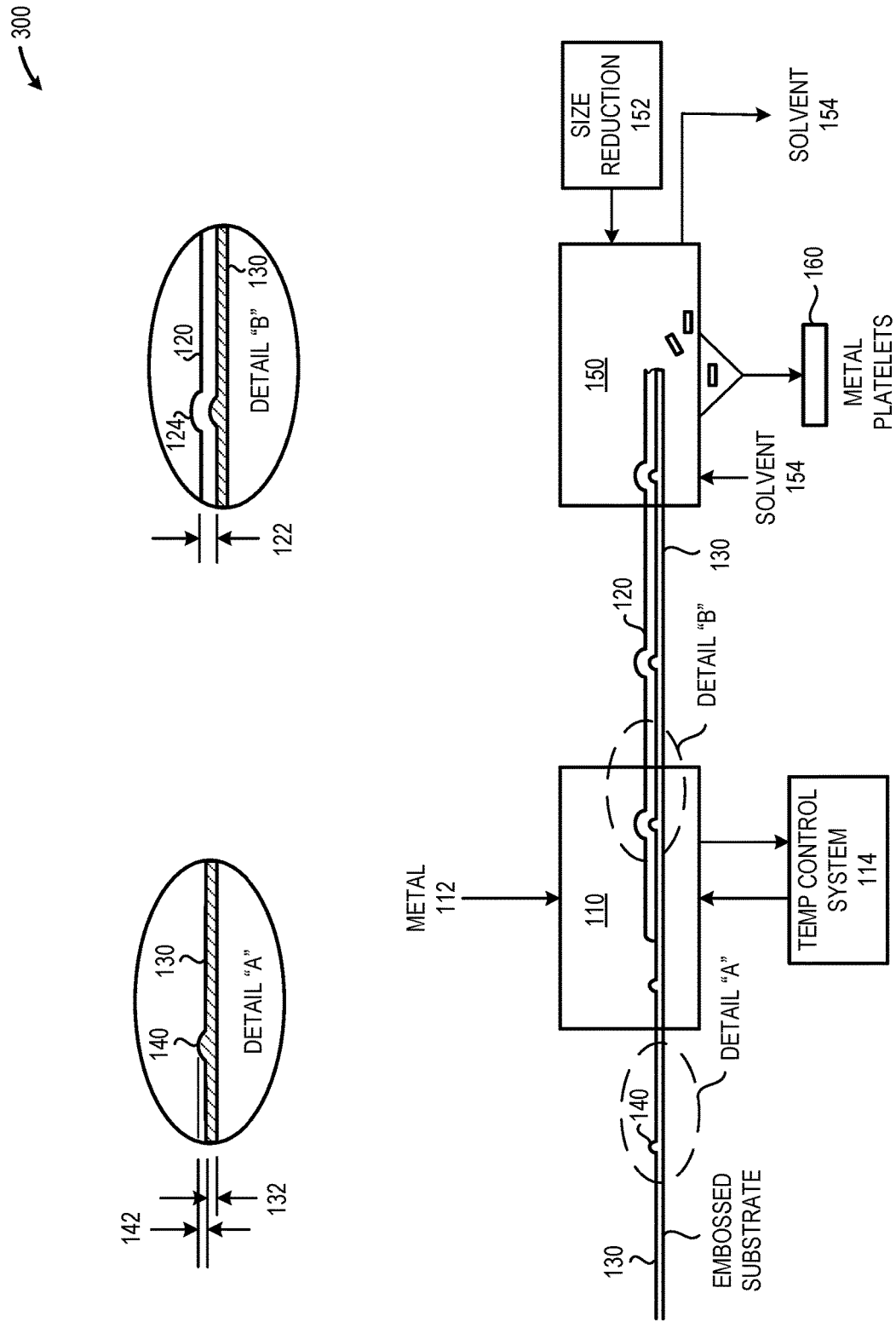
FIG. 3 is a block flow diagram of an illustrative platelet production system that includes a metal deposition system to deposit one or more metal layers on a substrate that includes one or more raised surface features and a substrate removal system to separate the one or more metal layers from the substrate, in accordance with at least one embodiment described herein.

FIG. 3 is a block flow diagram of an illustrative platelet production system 300 that includes a metal deposition system 110 to deposit one or more metal layers 120 on a substrate 130 that includes one or more raised surface features 140 and a substrate removal system 150 to separate the one or more metal layers 120 from the substrate 130, in accordance with at least one embodiment described herein. Deposition of the metal layer 120 having a thickness 122 across at least a portion of the one or more raised surface features 140 produces a metal layer 120 having a fracture pattern 124 that includes a network of "U-shaped" or "V-shaped" channels formed in the metal layer 120 (See, FIG. 3, Detail "B"). As depicted in FIG. 3, the upper surface of the metal layer 120 follows the contours formed by all or a portion of the one or more raised surface features 140. The one or more raised surface features 140 thus form the fracture pattern 124 in the metal layer 120. The channels formed in metal layer 120 provide stress concentration points that facilitate the fracture of the metal layer 120 along the fracture pattern 124 formed by the one or more raised surface features 140. Thus, after separation from the substrate 130, the metal layer 120 may be selectively fractured along at least a portion of the fracture pattern 124 to create a plurality of metal platelets 160.

In embodiments where the substrate 130 includes one or more repeating raised surface features 140, the system 100 may selectively produce metal platelets 160 having a defined thickness, aspect ratio, and/or physical geometry. For example, the system 100 may produce metal platelets 160 having a hexagonal physical geometry, a thickness, and an aspect ratio within a defined range (e.g., platelets having an aspect ratio greater than or equal to 5:1 or less than or equal to 10:1). In embodiments where the substrate 130 includes one or more non-repeating raised surface features 140, the system 100 may produce metal platelets 160 having a plurality of different physical geometries and/or aspect ratios. For example, such a system may produce a plurality of metal platelets 160 in which a first portion of the plurality of metal platelets have a first physical geometry, thickness, and/or aspect ratio and a second portion of the plurality of metal platelets have a second physical geometry, thickness, and/or aspect ratio that differs from the first physical geometry, the first thickness, and/or the first aspect ratio. Thus, combinations or mixtures of metal platelets 160 produced using the system 300 may be adjusted to meet a particular application simply by adjusting, changing, or altering the one or more raised surface features 140 on the substrate 130.

In embodiments, 50% or more of the metal platelets 160 produced using the system 300 may have an aspect ratio of greater than 5:1. In one or more preferred embodiments, 60% or more; 70% or more; 80% or more; 90% or more of the metal platelets 160 produced by the system 300 may have an aspect ratio of greater than or equal to 5:1. In embodiments, the system 300 may produce metal platelets 160 having an aspect ratio of: greater than or equal to 5:1 or less than or equal to 10:1.

As depicted in FIG. 3, the substrate 130 may include any number or combination of materials that include one or more raised surface features 140. The substrate 130 may include a rigid, semi-rigid, or flexible material. The one or more raised surface features 140 may include any number and/or combination of repeating and/or non-repeating raised patterns. In some embodiments, the one or more raised surface features 140 may include a regular polygonal pattern (triangle, square, pentagon, hexagon, etc.). In such embodiments, the polygonal shapes may have the same or different longitudinal axis lengths. In other embodiments, the one or more raised surface features 140 may include a repeating or non-repeating circular or oval pattern. Beneficially, the one or more raised surface features 140 may be selected to provide a plurality of metal platelets 160 having one or more desirable physical and/or chemical parameters. For example, the dimensions of the one or more raised surface features 140 may be selected to provide a desired bed packing density, melt rate, or similar.

The one or more raised surface features 140 disposed on or about at least a portion of the upper surface of the substrate 130 may be formed integral with the substrate 130, may be formed separately and thermally bonded to the substrate 130, or may be formed separately and chemically bonded to the substrate 130. In embodiments, the one or more raised surface features 140 may be deposited on or about upper surface the substrate 130 using any available material deposition process, system or method. For example, the one or more raised surface features 140 may be disposed on or about the upper surface of the substrate 130 using 3D printing or photolithography. The one or more raised surface features 140 may project or extend a distance 142 from the upper surface of the substrate 130. Although depicted as generally semicircular "U-shaped" in profile in FIG. 3, the one or more raised surface features 140 may have any cross-sectional geometry including but not limited to: square, rectangular, oval, elliptical, triangular, or combinations thereof. For example, in some embodiments, the one or more raised surface features 140 may have a "V"-shaped profile.

In embodiments, the one or more raised surface features 140 may form a regular, repeating, or uniform pattern, for example, the one or more raised surface features 140 may define a pattern containing a plurality of similarly or differently sized polygons, circles, ovals, trapezoids, or similar regions having a defined physical geometry. In embodiments, the one or more raised surface features 140 may form an irregular, non-repeating, or non-uniform pattern. For example, the one or more raised surface features 140 may form a random pattern on the surface of the substrate 130.

Figure 4:
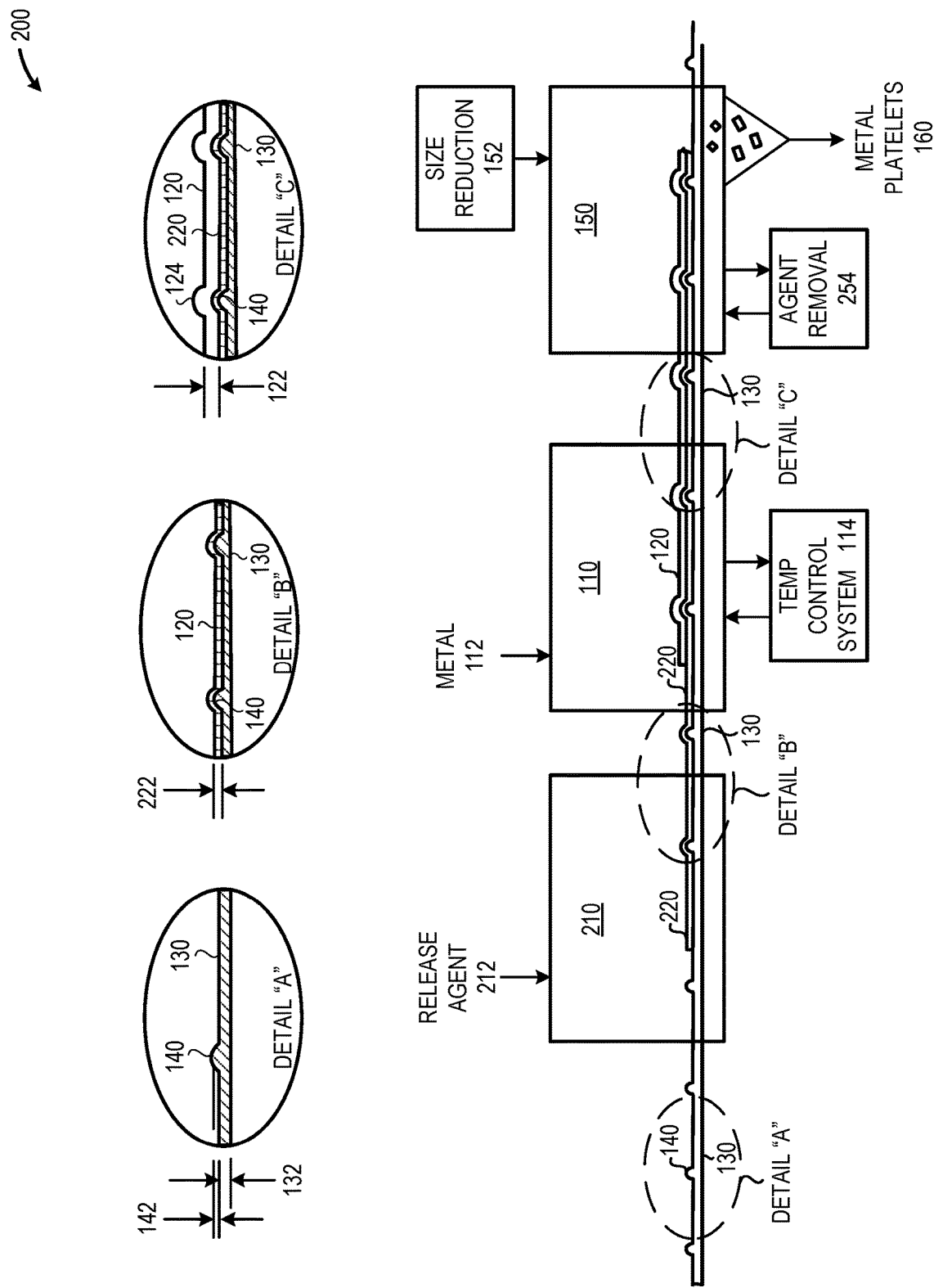
FIG. 4 is a block flow diagram of an illustrative platelet production system that includes a release agent application sub-system to deposit one or more release agents to provide a release agent layer between the substrate and the metal layer, in accordance with at least one embodiment described herein.

FIG. 4 is a block flow diagram of an illustrative platelet production system 400 that includes a release agent application sub-system 210 to deposit one or more release agents 212 to provide a release agent layer 220 between the substrate 130 and the metal layer 120, in accordance with at least one embodiment described herein. The release agent layer 220 may facilitate the separation of the metal layer 120 from the substrate 130. In embodiments, the release agent 212 may include one or more materials soluble in one or more polar solvents and/or one or more non-polar solvents. In embodiments, the release agent application sub-system 210 may apply the release agent 212 to all or a portion of the substrate 130 prior to deposition of the metal layer 120 on, across, or about all or a portion of the substrate 130. As depicted in FIG. 4, in embodiments using a release agent 212, the metal separation sub-system 150 may include one or more release agent removal sub-systems 254 that remove all or a portion of the release agent layer 220 to facilitate the separation of the metal layer 120 from the substrate 130.

Figure 5:
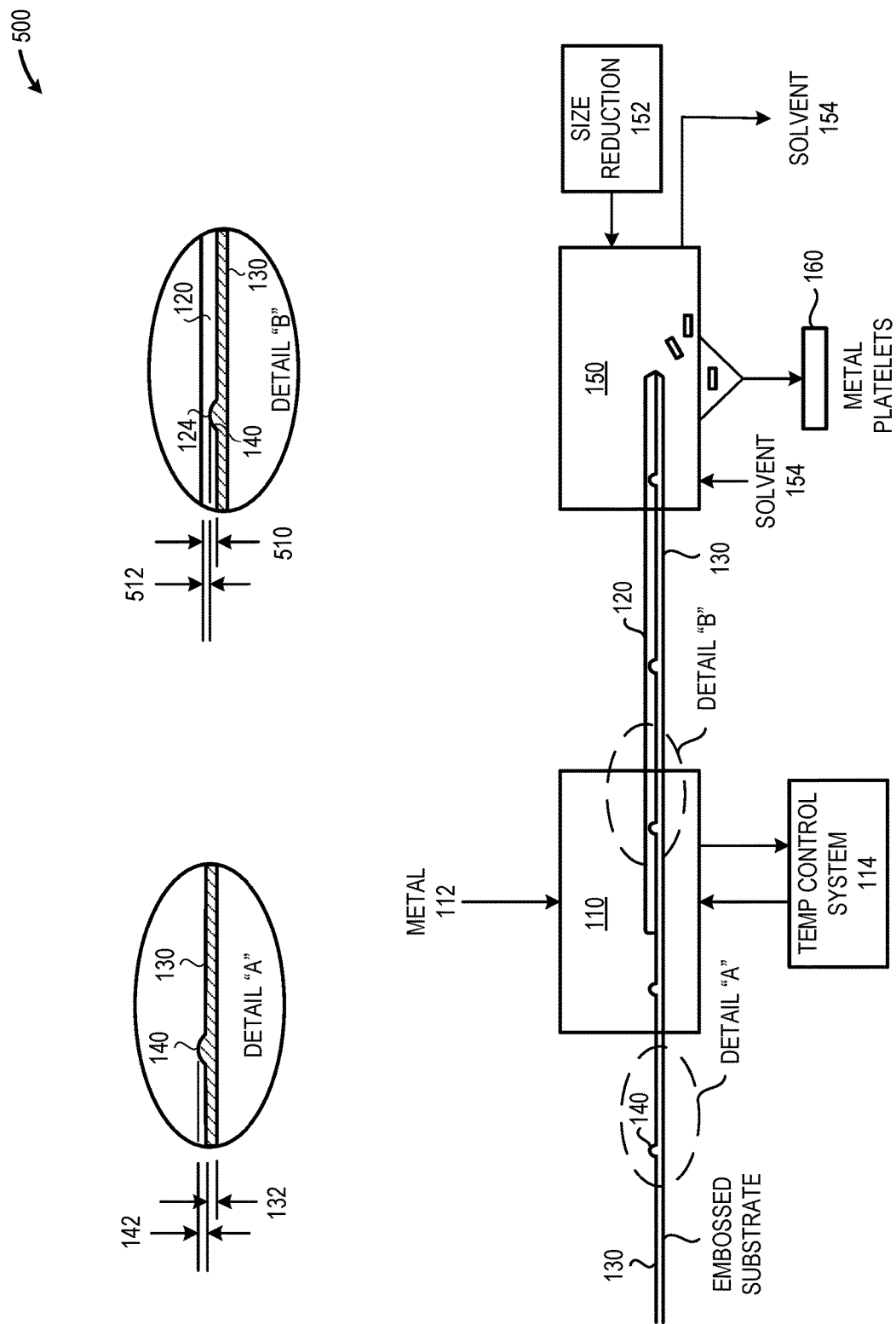
FIG. 5 is a block flow diagram of an illustrative platelet production system that includes a metal deposition system to deposit one or more metal layers on a substrate that includes a one or more repeating or non-repeating, raised, surface features and a substrate removal system to separate the one or more metal layers from the substrate, in accordance with at least one embodiment described herein.

FIG. 5 is a block flow diagram of an illustrative platelet production system 500 that includes a metal deposition system 110 to deposit one or more metal layers 120 on a substrate 130 that includes a one or more repeating or non-repeating, raised, surface features 140 and a substrate removal system 150 to separate the one or more metal layers 120 from the substrate 130, in accordance with at least one embodiment described herein. As depicted in FIG. 5, in embodiments, the upper surface of the metal layer 120 may be planar, and the contours formed by all or a portion of the one or more raised surface features 140 may produce platelets 160 having a first metal thickness 510 and a network of channels corresponding to the one or more raised surface features 140 that have a second metal thickness 512 to form the fracture pattern 124 in the metal layer 120. After separation from the substrate 130, the metal layer 120 includes a relatively thick metal portion having a thickness of 510 that forms the metal platelets 160 and a fracture pattern 124 of relatively thin metal portion having a thickness 512 that corresponds to the one or more raised surface features 140.

After separation from the substrate 130, the metal layer 120 fractures along the reduced metal thickness fracture pattern 124 to create the plurality of metal platelets 160. In embodiments where the substrate 130 includes one or more repeating, raised, surface features 140, the system 100 may beneficially produce metal platelets 160 having a defined thickness, aspect ratio, and/or physical geometry. For example, the system 100 may produce metal platelets 160 having a hexagonal physical geometry, a thickness, and an aspect ratio having defined parameters and/or within a defined range. In embodiments where the substrate 130 includes a one or more non-repeating, raised, surface features 140, the system 100 may also produce metal platelets 160 having two or more differing physical geometries and/or aspect ratios.

In embodiments, 50% or more of the metal platelets 160 produced using the system 500 may have an aspect ratio of greater than or equal to 5:1. In one or more preferred embodiments, 60% or more; 70% or more; 80% or more; or 90% or more of the metal platelets 160 produced using the system 500 have an aspect ratio of greater than or equal to 5:1. In embodiments, the metal platelets 160 produced by system 500 may have an aspect ratio of: greater than or equal to 5:1 or less than or equal to 10:1.

Although only two metal layer thicknesses are depicted in FIG. 5, any number of metal layer thicknesses may be formed by varying the height or projection 142 of the one or more raised surface features 140 disposed in, on, about, or across at least a portion of the upper surface of the substrate 130. In such a manner, selective comminution of the metal layer 130 may be performed. The fracture pattern 124 formed in the metal layer 120 corresponds to the pattern formed by the one or more raised surface features 140 disposed in, on, about, or across at least a portion of the upper surface of the substrate 130.

Figure 6:
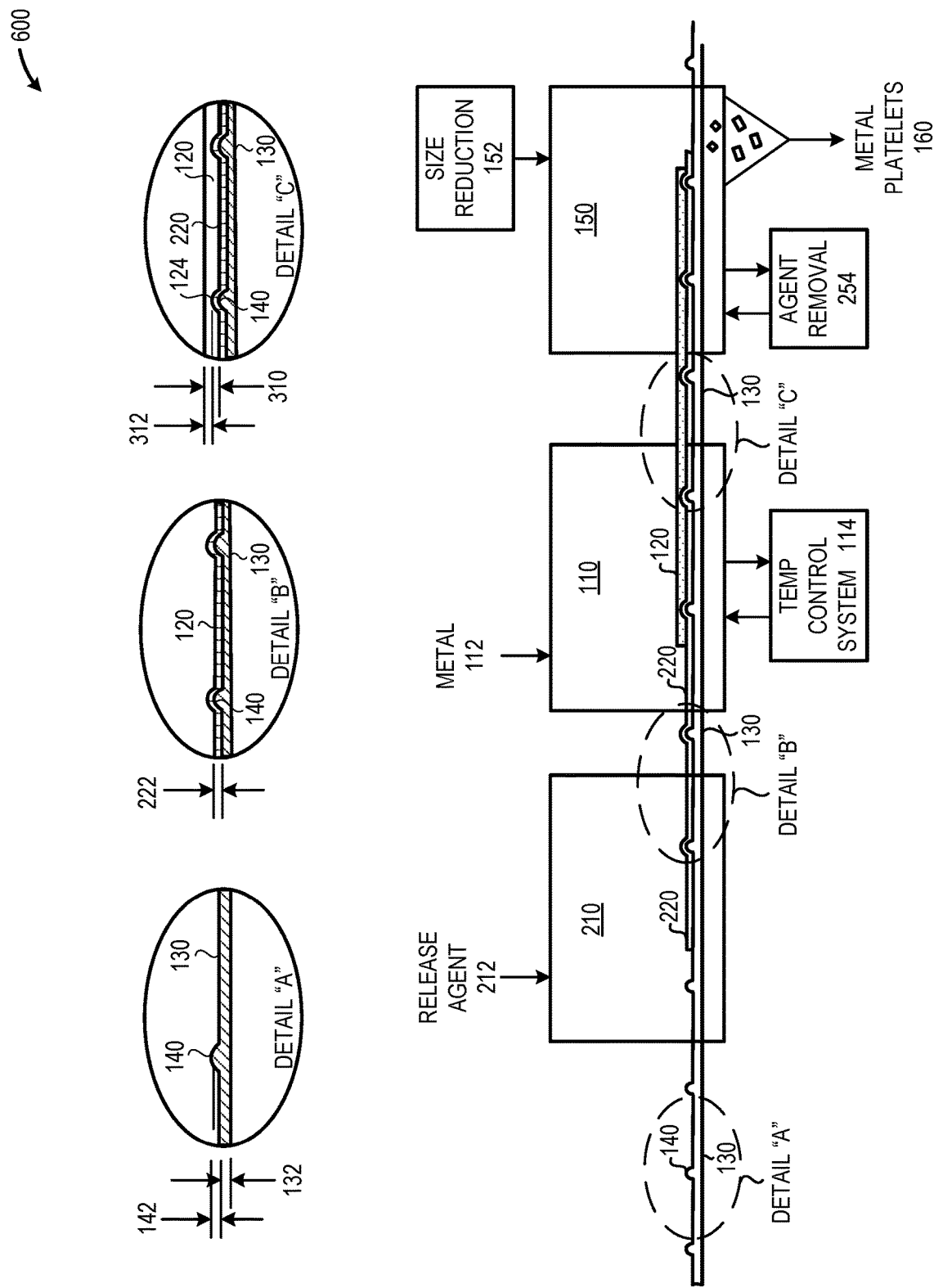
FIG. 6 is a block flow diagram of an illustrative platelet production system that includes a release agent application sub-system to deposit one or more release agents to provide a release agent layer between the substrate and the metal layer, in accordance with at least one embodiment described herein.

FIG. 6 is a block flow diagram of an illustrative platelet production system 600 that includes a release agent application sub-system 210 to deposit one or more release agents 212 to provide a release agent layer 220 between the substrate 120 and a metal layer 120 having a planar upper surface, in accordance with at least one embodiment described herein. The release agent layer 220 may facilitate the separation of the metal layer 120 from the substrate 130. In embodiments, the release agent 212 may include one or more materials soluble in one or more polar solvents and/or one or more non-polar solvents. In embodiments, the release agent application sub-system 210 may apply the release agent 212 to all or a portion of the substrate 130 prior to deposition of the metal layer 120 on, across, or about all or a portion of the substrate 130. As depicted in FIG. 6, in embodiments using a release agent 212, the metal separation sub-system 150 may include one or more release agent removal sub-systems 254 that remove all or a portion of the release agent layer 220 to facilitate the separation of the metal layer 120 from the substrate 130.

Figure 7:
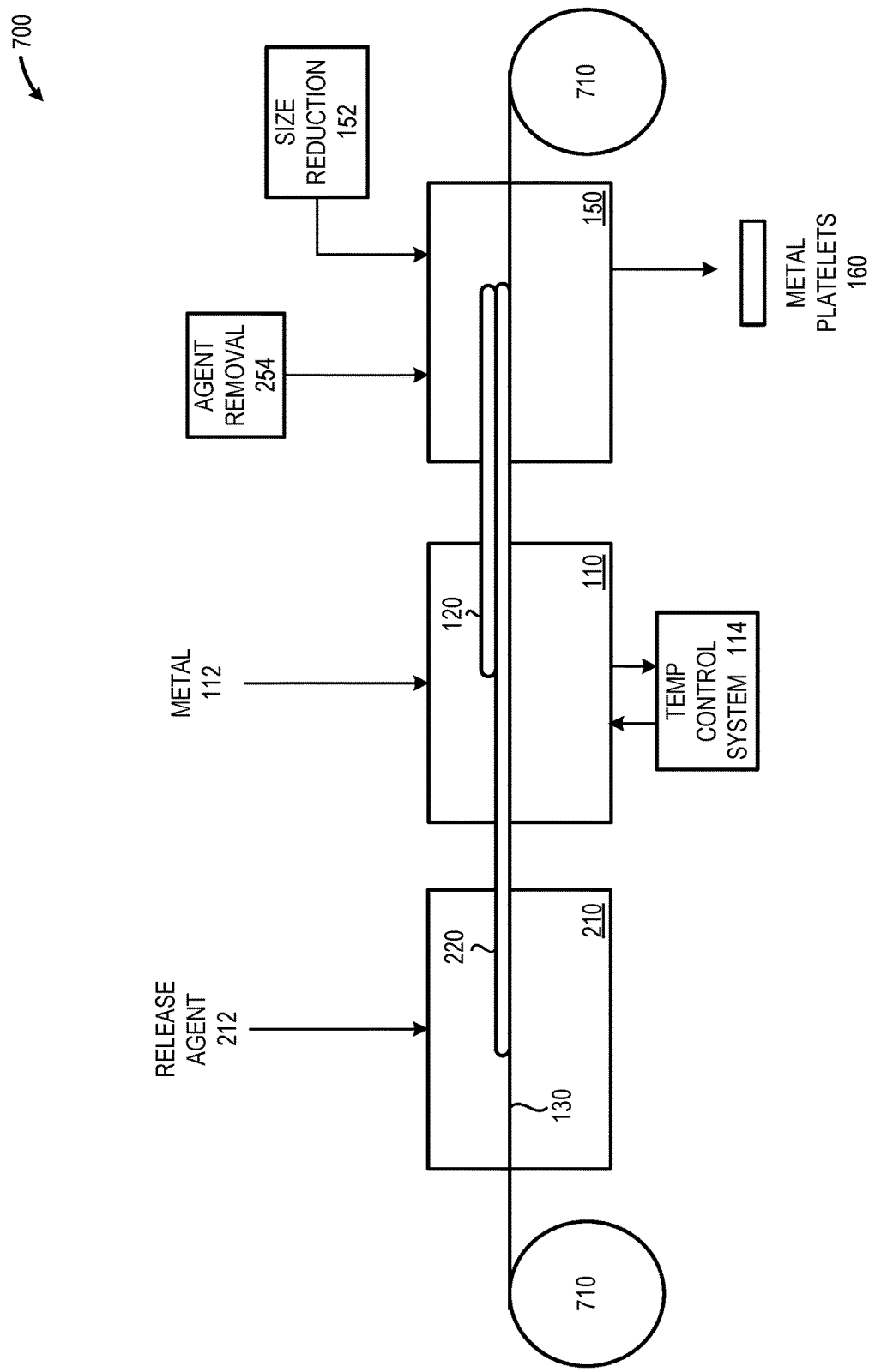
FIG. 7 is a block flow diagram of an illustrative continuous platelet production system that includes a roll-to-roll substrate feed system, in accordance with at least one embodiment described herein.

FIG. 7 is a block flow diagram of an illustrative continuous platelet production system 700 that includes a roll-to-roll substrate feed system 710, in accordance with at least one embodiment described herein. In embodiments, the substrate 130 may include one or more flexible materials, such as one or more flexible polymeric materials capable of passing through the release agent application sub-system 210, the metal deposition sub-system 110, and the metal separation sub-system 150. In embodiments, the substrate 130 may include one or more recessed surface features 140, one or more raised surface features 140, or combinations thereof. Using the continuous platelet production system 700, the substrate 130 passes through the release agent application sub-system 210 where one or more release agents 212 are disposed on, across, or about at least a portion of the substrate 130 to provide the release agent layer 220. The substrate 130 then passes through the metal deposition sub-system 110 where one or more metals 112 are disposed on, across, or about at least a portion of the release agent layer 220. The one or more raised surface features 140 on the substrate creates a reduced thickness fracture pattern 124 in the metal layer 120. The substrate 130, containing the release agent layer 220 and the metal layer 120, passes through the metal separation sub-system 150 where the release agent removal sub-system 254 decomposes at least a portion of the release agent layer 220 causing the separation of the metal layer 120 from the substrate 130. The size reduction sub-system fractures the metal layer 120 along the fracture pattern 124, producing the plurality of metal platelets 160.

Figure 8:
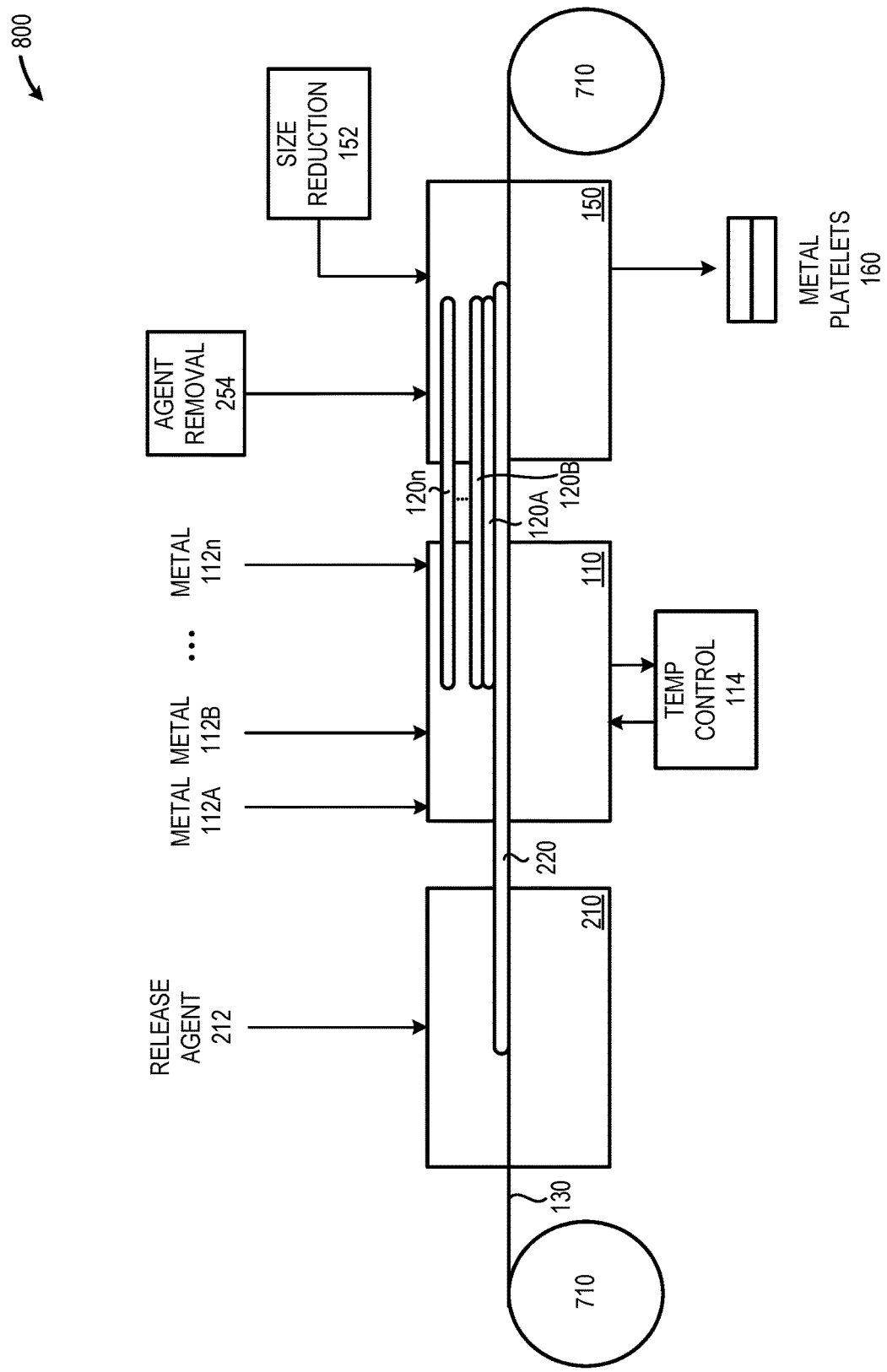
FIG. 8 is a block flow diagram of an illustrative continuous platelet production system that includes a metal deposition sub-system capable of depositing or otherwise disposing one or more metals on the upper surface of the substrate to provide a plurality of metal layers on, across, or about at least a portion of the substrate or on, across, or about at least a portion of the release layer, in accordance with at least one embodiment described herein.

FIG. 8 is a block flow diagram of an illustrative continuous platelet production system 800 that includes a metal deposition sub-system 110 capable of depositing or otherwise disposing one or more metals 112A-112n on the upper surface of the substrate 130 to provide a plurality of metal layers 120A-120n on, across, or about at least a portion of the substrate 130 or on, across, or about at least a portion of the release layer 220, in accordance with at least one embodiment described herein. In other embodiments, a plurality of metals 112A-112n may be deposited on, across, or about at least a portion of the substrate 130 or on, across, or about the release layer 220. In embodiments, a plurality of metals 112A-112n may form a single metal layer 120 deposited or otherwise disposed on, across, or about at least a portion of the substrate 130 or on, across, or about the release layer 220. In embodiments, a plurality of metals 112A-112n may form a corresponding plurality of metal layers 120A-120n deposited or otherwise disposed on, across, or about at least a portion of the substrate 130 or on, across, or about the release layer 220. In at least some embodiments, the plurality of metals 112A-112n may form a one or more metal layers 120A-120n having a eutectic mixture. In some embodiments, at least one of the plurality of metals 112A-112n may promote adhesion, bonding, and/or homogeneity between layers when the metal is deposited during an additive manufacturing (AM) process.

Figure 9B:
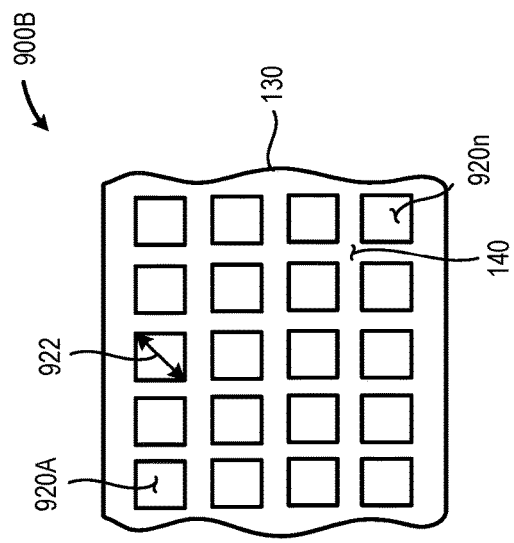
FIG. 9B depicts an illustrative substrate in which the one or more raised or recessed surface features forms a plurality of rectangles/squares in the substrate, in accordance with at least one embodiment described herein.
Figure 9A:
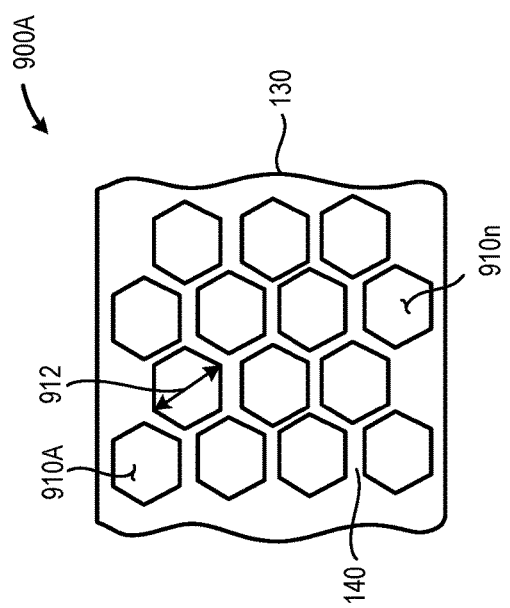
FIG. 9A is a plan view of an illustrative substrate in which the one or more raised or recessed surface features form a plurality of hexagons in the substrate, in accordance with at least one embodiment described herein.

FIG. 9A is a plan view of an illustrative substrate 130 in which the one or more raised or recessed surface features 140 form a plurality of hexagons 910A-910n in the substrate, in accordance with at least one embodiment described herein. As depicted in FIG. 9A, the metal platelets 160 produced using such a substrate 130 would be hexagonal. In embodiments, the hexagon shaped metal platelets 160 produced using the substrate 130 depicted in FIG. 9A may have a longitudinal axis 512 length extending between opposed vertices. For example, the hexagon shaped metal platelets 160 produced using the substrate 130 depicted in FIG. 9A may have a longitudinal axis 912 having a length in the range of 1.0 μm to 500 μm.

FIG. 9B depicts an illustrative substrate 130 in which the one or more raised or recessed surface features 140 forms a plurality of rectangles/squares 920A-920n in the substrate 130, in accordance with at least one embodiment described herein. The metal platelets 160 produced using a substrate 130 having one or more raised or recessed surface features 140 such as depicted in FIG. 9B, would be square or rectangular. The square or rectangular shaped metal platelets 160 may have any diagonal dimension 922. For example, the rectangular shaped metal platelets 160 produced using the substrate 130 depicted in FIG. 9B may have a diagonal dimension 922 in the range of 1.0 μm to 500 μm.

Figure 9C:
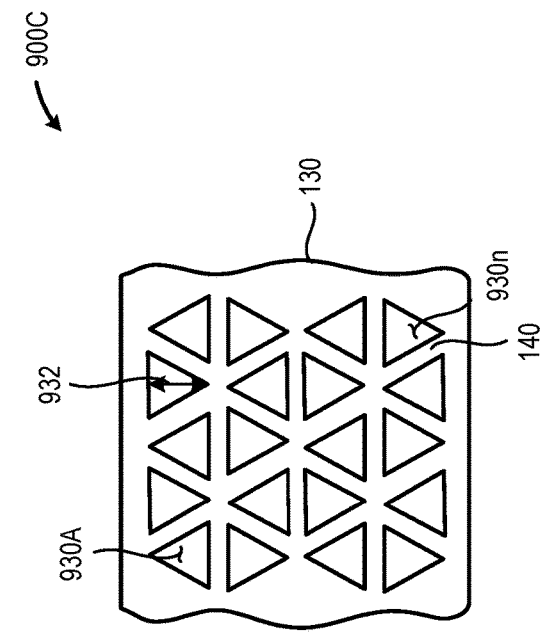
FIG. 9C depicts an illustrative substrate in which the one or more raised or recessed surface features form a plurality of triangles, in accordance with at least one embodiment described herein.

FIG. 9C depicts an illustrative substrate 130 in which the one or more raised or recessed surface features 140 form a plurality of triangles 930A-930n, in accordance with at least one embodiment described herein. As depicted in FIG. 9C, the metal platelets 160 produced using such a substrate 130 would be triangular and have a dimension 932 of 1.0 μm to 500 μm.

Figure 10:
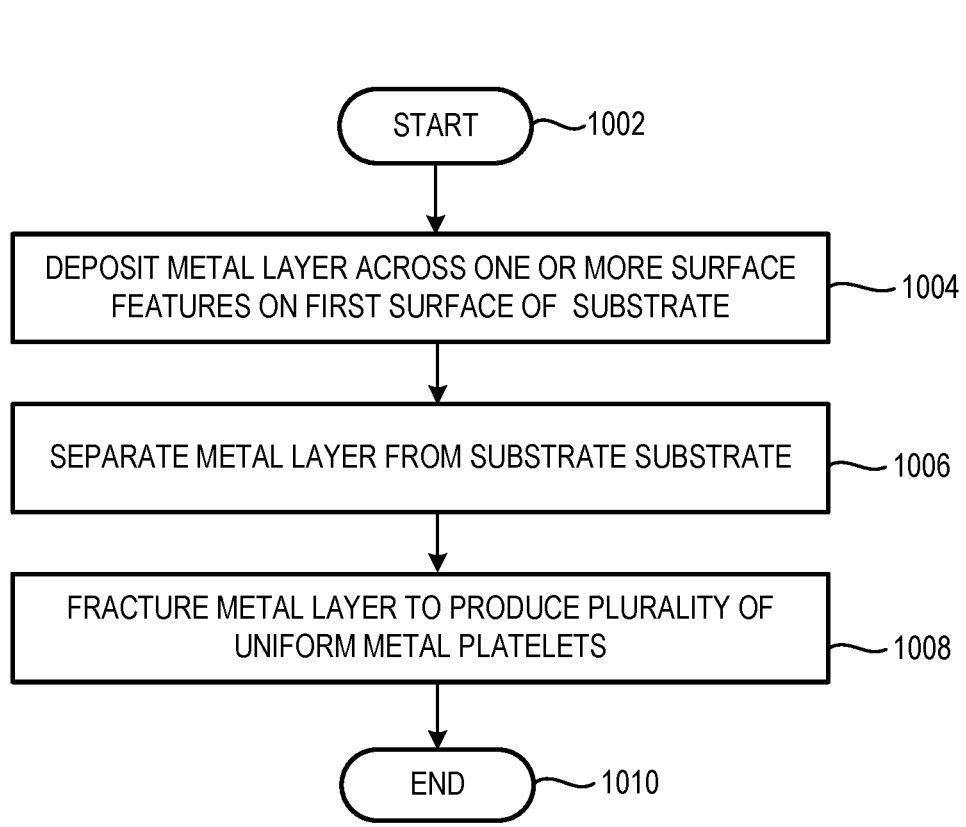
FIG. 10 is a high-level flow diagram of an illustrative method for producing metal platelets having a physical geometry using a substrate that includes one or more raised or recessed surface features in accordance with at least one embodiment described herein.

FIG. 10 is a high-level flow diagram of an illustrative method 1000 for producing metal platelets 160 having a physical geometry using a substrate 130 that includes one or more raised or recessed surface features 140 in accordance with at least one embodiment described herein. The presence of the one or more raised or recessed surface features 140 on the substrate 130 creates a fracture pattern 124 in the metal layer 120. In embodiments, the fracture pattern 124 may include a repeating or non-repeating pattern of "U-shaped" or "V-shaped" surface features (e.g., depressions and/or ridges) in the metal layer 120. Thus, the physical geometry and/or aspect ratio of the metal platelets 160 may be altered or adjusted by controlling the fracture pattern 124 formed in the metal layer 120. In this manner metal platelets having fairly high aspect ratios (e.g., greater than or equal to 5:1—principal plane axis to platelet thickness) may be readily produced in large quantities. The one or more raised or recessed surface features 140 may be formed integral with the substrate 130 (e.g., stamped or otherwise pressed into the substrate 130) or may be deposited on the surface of a smooth substrate 130 using conventional metal deposition technology (e.g., photolithography, subtractive manufacturing). In embodiments, the substrate 130 may be heated or cooled in preparation for deposition of the one or more metals 112 forming the metal layer 120. The method 1000 commences at 1002.

At 1004, one or more metals 112 are deposited or otherwise disposed on, about, or across at least a portion of the one or more raised or recessed surface features 140 disposed in, on, about, or across at least a portion of the upper surface of the substrate 130. In embodiments, the one or more metals 112 may include a eutectic mixture. In embodiments, the one or more metals 112 may be deposited or otherwise disposed across at least a portion of the one or more raised or recessed surface features 140 using any material deposition system, process, or method. The one or more metals 112 may be deposited as a single, relatively thick, layer or may be deposited as a plurality of relatively thin layers. Example material deposition methods include but are not limited to: physical vapor deposition, chemical vapor deposition, vacuum plating, electroless plating, or combinations thereof. The one or more raised or recessed surface features 140 formed on the upper surface of the substrate 130 forms a fracture pattern 124 in the metal layer 120 to facilitate the subsequent comminution of the metal layer 120 to provide the plurality of metal platelets 160.

At 1006, the metal layer 120 is separated from the substrate 130. In embodiments, the substrate 130 may be formed using a thermally, physically, or chemically degradable material. In such instances, the metal layer 120 may be separated by degrading or decomposing at least a portion of the substrate 130. In other embodiments, the substrate 130 may be "peeled" away from the metal layer 120. In yet other embodiments, the metal layer 120 may be heated or cooled to facilitate the release of the substrate 130. In some embodiments, the substrate 130 may decompose when exposed to a polar solvent. In such instances, the metal layer 120 may be separated from the substrate 130 by soaking the substrate 130 in an appropriate polar solvent or mixture of polar solvents. In some embodiments, the substrate 130 may decompose when exposed to a non-polar solvent. In such instances, the metal layer 120 may be separated from the substrate 130 by soaking the substrate 130 in an appropriate non-polar solvent or mixture of non-polar solvents. In yet other embodiments the substrate 130 may decompose when exposed to heat. In such instances, the metal layer 120 may be separated from the substrate 130 by heating the substrate 130 to a temperature sufficient to cause degradation.

At 1008, the metal layer 120 is fractured to provide a plurality of metal platelets 160. In embodiments, upon separation of the metal layer 120 from the substrate 130, the one or more raised or recessed surface features 140 create a fracture pattern 124 in the metal layer 120. In embodiments, the fracture pattern 124 may include a repeating or non-repeating pattern of surface features in the metal layer 120 as depicted in FIGS. 1 through 6. At least a portion of the metal layer 120 may spontaneously fracture upon separation from the structural support provided by the substrate 130. To ensure the metal layer 120 fractures completely to provide the plurality of metal platelets 160, one or more physical and/or chemical size reduction systems or devices 152 may be used. In such instances, all or a portion of the metal layer 120 may pass through the size reduction systems or devices 152. The method 1000 concludes at 1010.

Figure 11:
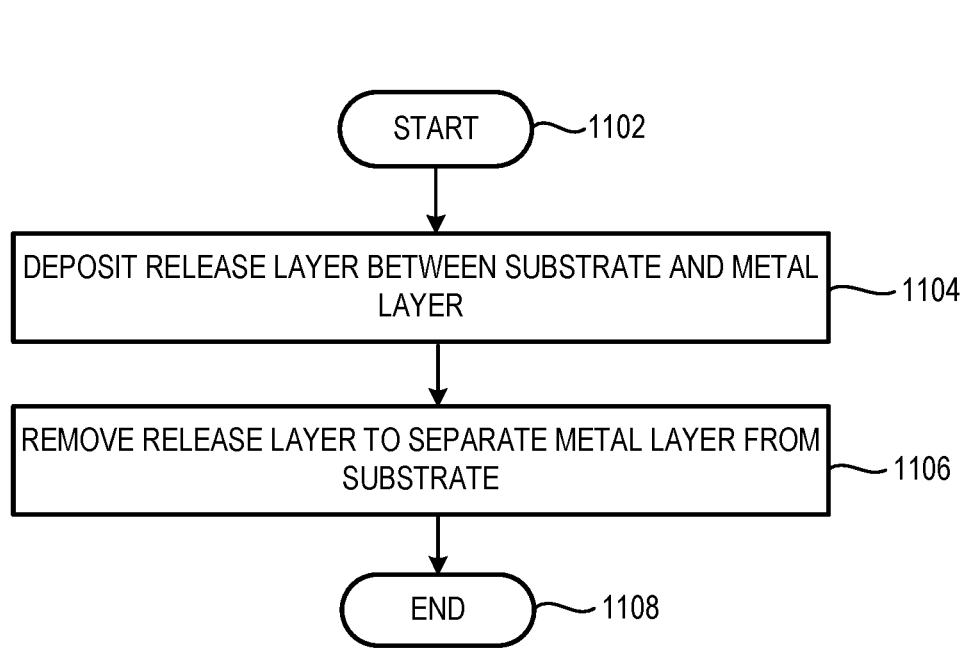
FIG. 11 is a high-level flow diagram of an illustrative method in which a release agent is deposited or otherwise disposed on, about, or across at least a portion of the substrate to form a release layer, in accordance with at least one embodiment described herein.

FIG. 11 is a high-level flow diagram of an illustrative method 1100 in which a release agent 212 is deposited or otherwise disposed on, about, or across at least a portion of the substrate 130 to form a release layer 220, in accordance with at least one embodiment described herein. The release layer 220 facilitates the separation of the metal layer 120 from the substrate 130. In embodiments, the release layer 200 may include one or more physically, chemically, or thermally degradable materials that, when degraded, permit the separation of the metal layer 120 from the substrate 130. The method 1100 commences at 1102.

At 1104, one or more release agents 212 are deposited or otherwise disposed on, about, or across at least a portion of the substrate 130 including some or all of the one or more raised or recessed surface features 140. In embodiments, the one or more release agents 212 may be deposited as a liquid, as a slurry, or as a dry solid material. In at least some implementations, the one or more release agents 212 may include one or more water soluble salts, such as sodium chloride (NaCl). In such implementations, the sodium chloride may be applied to the substrate as a dry solid material or as a sodium chloride solution that is dried to form a layer of crystalline sodium chloride on the surface of the substrate 130. In embodiments, the release layer 220 formed by the one or more release agents 212 follows the contours of the one or more raised or recessed surface features 140 on the substrate 130. In other words, the release layer only minimally or ideally, does not, obscure or reduce the surface features provided by the one or more raised or recessed surface features 140. The one or more release agents 212 may be deposited or otherwise disposed on, about, or across all or a portion of the substrate 130 using any material deposition process. The release layer 220 may have any thickness. In embodiments, the release layer 220 may have a thickness of about: 0.5 micrometer ($\mu m$) or less; 1 $\mu m$ or less; 3 $\mu m$ or less; 5 $\mu m$ or less; 10 $\mu m$ or less; 25 $\mu m$ or less; or 50 $\mu m$ or less.

At 1106, the release layer 220 is at least partially decomposed or otherwise removed to facilitate the separation of the metal layer 120 from the substrate 130. In some embodiments, the release layer 220 may decompose when exposed to a polar solvent. In such instances, the release layer 220 may be at least partially removed or otherwise decomposed by soaking the release layer 220 in an appropriate polar solvent or mixture of polar solvents. In some embodiments, the release layer 220 may decompose when exposed to a non-polar solvent. In such instances, the release layer 220 may be at least partially removed or otherwise decomposed by soaking the release layer 220 in an appropriate non-polar solvent or mixture of non-polar solvents. In yet other embodiments the release layer 220 may be at least partially removed or otherwise decomposed when exposed to heat. In such instances, the release layer 220 may decompose when exposed to a temperature sufficient to cause degradation. The method 1100 concludes at 1106.

Figure 12:
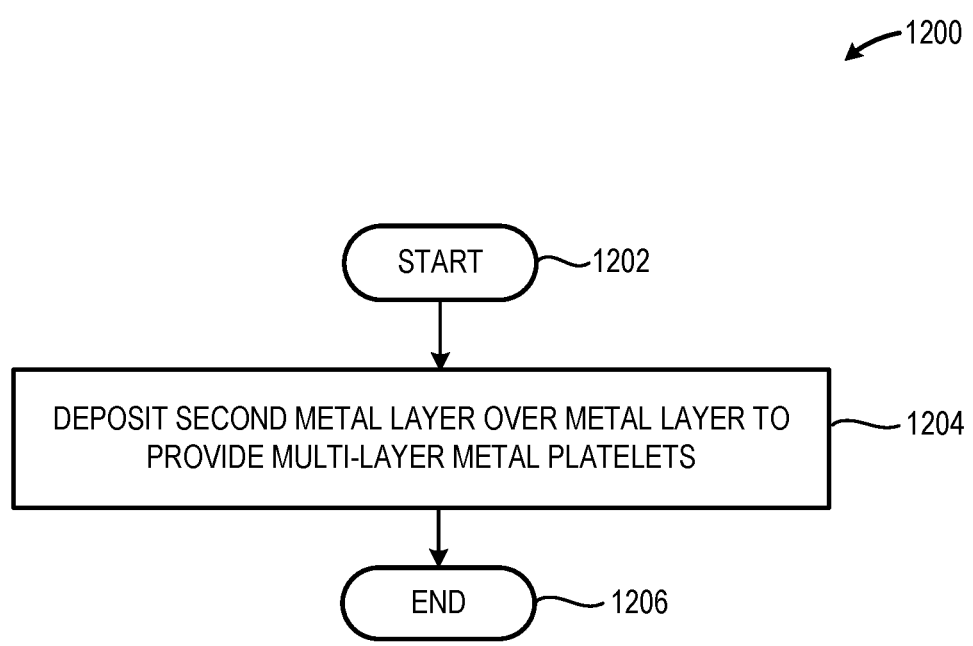
FIG. 12 is a high-level flow diagram of an illustrative method of forming a multi-layer metal layer on the substrate, in accordance with at least one embodiment described herein.

FIG. 12 is a high-level flow diagram of an illustrative method 1200 of forming a multi-layer metal layer 120 on the substrate 130, in accordance with at least one embodiment described herein. In some implementations, benefits may accrue by depositing one or more metals 112A-112$n$ as a number of layers to form the metal layer 120. For example, in some embodiments, the metal layer 120 may include a plurality of metal layers 120A-120$n$ (See, FIG. 8), each including the same or different composition. In another example, the metal layer 120 may include a plurality of metal layers 120A-120$n$ that include layers formed from each of a plurality of metals 112A-112$n$ that, together, provide a eutectic mixture. The method 1200 commences at 1202.

At 1204, one or more metal layers 120A-120$n$ are deposited or otherwise disposed on, about, or across at least a portion of the first metal layer 120B deposited over or across the one or more raised or recessed surface features 140 formed on the surface of the substrate 130. Any material deposition system, process, or method may be used to deposit the metal layers 120 on the substrate 130. In embodiments, the same material deposition system, process, or method may be used to dispose or deposit each of a plurality of metal layers 120A-120$n$. In other embodiments, material deposition system, process, or method may be used to dispose or deposit each of a plurality of metal layers 120A-120$n$. The method concludes at 1206.

While FIGS. 10 through 12 illustrate various operations according to one or more embodiments, it is to be understood that not all of the operations depicted in FIGS. 10 through 12 are necessary for other embodiments. Indeed, it is fully contemplated herein that in other embodiments of the present disclosure, the operations depicted in FIGS. 10 through 12, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Thus, the present disclosure is directed to systems and methods for producing a metal-containing powder useful for additive manufacturing. The metal-containing powder includes a plurality of metal-containing platelets having a defined physical geometry and a defined aspect ratio. The metal platelets may be produced by depositing a metal layer on a substrate that includes one or more recessed or raised surface features. The one or more surface features create a fracture pattern in a metal layer deposited across at least a portion of the one or more surface features. By separating the metal layer from the substrate and fracturing the metal layer along the fracture pattern, a plurality of metal platelets are produced. In some embodiments, a release agent may be disposed between the metal layer and the substrate to facilitate the separation of the metal layer from the substrate.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A metal platelet manufacturing method, comprising:
providing a substrate having a first surface including one or more surface features disposed across at least a portion of said first surface;
depositing at least one metal layer across at least a portion of said one or more substrate surface features via vacuum deposition;
forming at least one metal layer having a fracture pattern corresponding to said one or more surface features of said substrate first surface;
separating the metal layer from the substrate; and
fracturing the metal layer along at least a portion of the fracture pattern to provide a plurality of metal platelets, one or more of the platelets having an aspect ratio greater than or equal to 5:1.

2. The method of claim 1 wherein said substrate one or more surface features comprises one or more recessed surface features and depositing the at least one metal layer across at least a portion of said one or more recessed surface features of the first surface of the substrate.

3. The method of claim 1 wherein depositing at least one metal layer across at least a portion of one or more surface features disposed across at least a portion of the first surface of the substrate comprises:
depositing the at least one metal layer across at least a portion of one or more raised surface features disposed across at least a portion of the first surface of the substrate.

4. The method of claim 1 wherein separating the metal layer from the substrate comprises:
decomposing at least a portion of the substrate to separate at least a portion of the metal layer from the substrate.

5. The method of claim 1, further comprising:
depositing a release agent across at least a portion of the one or more surface features disposed across at least a portion of the first surface of the substrate such that the release agent is disposed at least partially between the metal layer and the one or more surface features on the first surface of the substrate.

6. The method of claim 5 wherein separating the metal layer from the substrate comprises:
decomposing at least a portion of the release agent to separate at least a portion of the metal layer from the substrate.

7. The method of claim 6:
wherein depositing the release agent on the substrate comprises:
depositing a first component that includes a water-soluble release agent on the substrate to provide at least a portion of the release layer; and
wherein decomposing at least a portion of the release agent further comprises:
at least partially submerging the metal coated substrate in an aqueous solution causing separation of at least a portion of the metal layer from the substrate.

8. The method of claim 7, further comprising:
separating the metal platelets from the aqueous solution.

9. The method of claim 1 wherein depositing at least one metal layer across at least a portion of the one or more surface features disposed at least partially across the first surface of the substrate comprises:
depositing the at least one metal layer across at least a portion of the one or more surface features disposed across at least a portion of the first surface of the substrate;
wherein the substrate includes a roll-to-roll continuous substrate.

10. The method of claim 1 wherein depositing the at least one metal layer across at least a portion of said substrate one or more surface features comprises:
depositing the at least one metal layer across at least a portion of a repeating surface feature pattern disposed across at least a portion of the first surface of the substrate to produce metal platelets such that 50% or more of the metal platelets have an aspect ratio of greater than or equal to 5:1.

11. The method of claim 1 wherein depositing the at least one metal layer across at least a portion of the one or more surface features disposed across at least a portion of the first surface of the substrate comprises:
depositing the at least one metal layer across at least a portion of a non-repeating surface feature pattern disposed across at least a portion of the first surface of the substrate to produce a plurality of metal platelets such that:
the plurality of metal platelets include a plurality of physical geometries; and
50% or more of the metal platelets included in the plurality of metal platelets have an aspect ratio of greater than or equal to 5:1.

12. The method of claim 1 wherein depositing the at least one metal layer across at least a portion of said substrate one or more surface features comprises:
depositing at least one of: a metal, a metal alloy, a metalloid, a metal oxide, a metal nitride, a metal boride; or a metal carbide.

13. The method of claim 1 wherein depositing the at least one metal layer across at least a portion of the one or more surface features across at least a portion of the first surface of the substrate comprises:
depositing a plurality of metal layers across at least the portion of the one or more surface features disposed across at least a portion of the first surface of the substrate to provide a multi-layer metal.

14. The method of claim 13 wherein depositing the plurality of metal layers across at least a portion of the one or more surface features disposed at across at least a portion of the first surface of the substrate to provide a multi-layer metal comprises:
depositing at least a second metal layer that includes a second metal across at least a portion of a first metal layer that includes a first metal, the second metal different from the first metal.

15. The method of claim 1 wherein depositing the at least one metal layer across at least a portion of said substrate one or more surface features comprises:
depositing the at least one metal layer using at least one of: electron beam evaporation, thermal evaporation, or sputtering.

16. The method of claim 1 wherein fracturing the metal layer along at least a portion of the fracture pattern to provide the plurality of metal platelets further comprises:
fracturing the metal layer along at least a portion of the fracture pattern to provide a plurality of metal platelets, each of the plurality of metal platelets having an aspect ratio of from 5:1 to 10:1.

17. The method of claim 1 wherein depositing the at least one metal layer across at least a portion of said substrate one or more surface features comprises:
depositing the at least one metal layer across at least a portion of one or more raised surface features such that the upper surface of the at least one metal layer conforms to at least a portion of the one or more raised surface features.

18. The method of claim 1 wherein depositing the at least one metal layer across at least a portion of the one or more surface features disposed across at least a portion of the first surface of the substrate comprises:
depositing the at least one metal layer across at least a portion of one or more raised surface features such that the upper surface of the at least one metal layer comprises a planar surface;
wherein the at least one metal layer includes a layer having a first thickness; and
wherein the fracture pattern includes a pattern having a second thickness corresponding to the at least one raised surface feature, the second metal thickness less than the first metal thickness.

19. A metal platelet manufacturing method, comprising:
moving a substrate that includes one or more surface features disposed at least partially across a first surface of the substrate from a substrate supply roll to a substrate take-up roll;
depositing one or more metal layers across at least a portion of the one or more surface features disposed at least partially across the first surface of the moving substrate, the one or more metal layers having a fracture pattern corresponding to at least a portion of the one or more surface features of said moving substrate;
separating the one or more metal layers from the substrate; and
fracturing the one or more metal layers along at least a portion of the fracture pattern to provide a plurality of metal platelets, one or more of the platelets having an aspect ratio of greater than or equal to 5:1.

20. The method of claim 19 wherein said moving substrate one or more surface features comprises one or more recessed surface features and depositing the one or more metal layers across at least a portion of said one or more recessed surface features disposed at least partially across the first surface of the moving substrate.

21. The method of claim 19 wherein said moving substrate one or more surface features comprises one or more raised surface features and
depositing the one or more metal layers across at least a portion of said one or more raised surface features disposed at least partially across the first surface of the moving substrate.

22. The method of claim 19 wherein depositing the one or more metal layers across at least a portion of the one or more surface features disposed at least partially across the first surface of the moving substrate further comprises:
depositing a first metal layer across at least a portion of one or more recessed surface features disposed at least partially across the first surface of the moving substrate, the first metal layer having a first metal thickness;
depositing a second metal layer across at least a portion of the first metal layer, the second metal layer having a second metal thickness, the second metal layer having a different composition than the first metal layer.

23. The method of claim 19, further comprising:
depositing one or more release agents between the one or more metal layers and the first surface of the moving substrate;
wherein separating the one or more metal layers from the substrate further comprises decomposing the one or more release agents.

24. The method of claim 23:
wherein depositing one or more release agents between the one or more metal layers and the first surface of the moving substrate comprises:
depositing a water-soluble release agent between the one or more metal layers and the first surface of the moving substrate; and
wherein decomposing the one or more release agents further comprises:
applying an aqueous solution to the water-soluble release agent to decompose the one or more release agents and provide a slurry containing the metal platelets in the aqueous solution.

25. The method of claim 24, further comprising:
separating the metal platelets from the aqueous solution.

26. The method of claim 19 wherein 50% or more of the metal platelets provided by said fracturing have an aspect ratio of greater than or equal to 5:1.

27. A metal platelet manufacturing method, comprising:
providing a substrate having a first surface including one or more repeating surface feature patterns disposed across at least a portion of said first surface;
depositing at least one metal layer via vacuum deposition across at least a portion of said one or more repeating surface feature patterns of said substrate first surface and forming at least one metal layer having a fracture pattern corresponding to said one or more repeating surface feature patterns of said substrate first surface;
separating the metal layer from the substrate; and
fracturing the metal layer along at least a portion of the fracture pattern to provide a plurality of metal platelets, such that 50% or more of said platelets have an aspect ratio greater than or equal to 5:1.

28. A metal platelet manufacturing method, comprising:
providing a substrate having a first surface including one or more surface features disposed across at least a portion of said first surface;
depositing at least one metal layer across at least a portion of said one or more surface features of said substrate first surface using at least one of electron beam evaporation, thermal evaporation or sputtering;
forming at least one metal layer having a fracture pattern corresponding to said one or more surface features of said substrate first surface;
separating the metal layer from the substrate; and
fracturing the metal layer along at least a portion of the fracture pattern to provide a plurality of metal platelets, one or more of the platelets having an aspect ratio greater than or equal to 5:1.

* * * * *